United States Patent
Xiang et al.

(10) Patent No.: US 12,082,457 B2
(45) Date of Patent: Sep. 3, 2024

(54) DISPLAY PANEL AND DISPLAY DEVICE

(71) Applicant: Wuhan China Star Optoelectronics Semiconductor Display Technology Co., Ltd., Hubei (CN)

(72) Inventors: Songpo Xiang, Hubei (CN); Jianlong Wu, Hubei (CN)

(73) Assignee: Wuhan China Star Optelectronics Semiconductor Display Technology Co., Ltd., Wuhan (CN)

( * ) Notice: Subject to any disclaimer, the term of this patent is extended or adjusted under 35 U.S.C. 154(b) by 938 days.

(21) Appl. No.: 16/973,558

(22) PCT Filed: Jul. 22, 2020

(86) PCT No.: PCT/CN2020/103424
§ 371 (c)(1),
(2) Date: Dec. 9, 2020

(87) PCT Pub. No.: WO2021/258475
PCT Pub. Date: Dec. 30, 2021

(65) Prior Publication Data
US 2022/0190085 A1 Jun. 16, 2022

(30) Foreign Application Priority Data
Jun. 22, 2020 (CN) .......................... 202010574886.6

(51) Int. Cl.
*H10K 59/131* (2023.01)
*G09G 3/3225* (2016.01)

(52) U.S. Cl.
CPC .................................. *H10K 59/131* (2023.02)

(58) Field of Classification Search
CPC ............... H10K 59/131; G09G 3/3225; G09G 2320/0209
See application file for complete search history.

(56) References Cited

U.S. PATENT DOCUMENTS

| 6,556,265 | B1 | 4/2003 | Murade |
| 2004/0051822 | A1 | 3/2004 | Sato |
| 2008/0186422 | A1* | 8/2008 | Ishii ..................... G02F 1/1368 349/110 |
| 2011/0085121 | A1 | 4/2011 | Jeon et al. |
| 2011/0260224 | A1 | 10/2011 | Hidaka |

(Continued)

FOREIGN PATENT DOCUMENTS

| CN | 1258357 | 6/2000 |
| CN | 1474219 | 2/2004 |

(Continued)

*Primary Examiner* — Omar F Mojaddedi

(57) ABSTRACT

A display panel and a display device are provided, which include a substrate, a plurality of data lines, a semiconductor layer, a first connecting hole, and a second connecting hole. The first connecting hole and the second connecting hole are positioned on two adjacent data lines, and the semiconductor layer in two adjacent areas has a mirror image arrangement with respect to a first direction. Therefore, connecting data signal lines to the semiconductor layer by bridging can be prevented, and problems of dense wirings, small adjustment space for pixel design, and greater crosstalk between circuits can be solved.

16 Claims, 3 Drawing Sheets

(56) References Cited

U.S. PATENT DOCUMENTS

| | | | |
|---|---|---|---|
| 2015/0200239 A1* | 7/2015 | Jung .................... | H10K 59/131 |
| | | | 257/40 |
| 2016/0079331 A1* | 3/2016 | Hwang ................ | H10K 59/131 |
| | | | 438/34 |
| 2017/0345877 A1* | 11/2017 | Hwang ................ | H10K 59/131 |

FOREIGN PATENT DOCUMENTS

| | | |
|---|---|---|
| CN | 1702531 | 11/2005 |
| CN | 101131519 | 2/2008 |
| CN | 101241285 | 8/2008 |
| CN | 102033365 | 4/2011 |
| CN | 102981333 | 3/2013 |
| CN | 105093599 | 11/2015 |
| CN | 105988255 | 10/2016 |
| CN | 106483728 | 3/2017 |
| JP | 2007-179077 | 7/2007 |

* cited by examiner

DISPLAY PANEL AND DISPLAY DEVICE

RELATED APPLICATIONS

This application is a National Phase of PCT Patent Application No. PCT/CN2020/103424 having International filing date of Jul. 22, 2020, which claims the benefit of priority of Chinese Patent Application No. 202010574886.6 filed on Jun. 22, 2020. The contents of the above applications are all incorporated by reference as if fully set forth herein in their entirety.

FIELD AND BACKGROUND OF THE INVENTION

The present disclosure relates to the field of display technologies, and more particularly, to a display panel and a display device.

With development of display technology, requirements for sizes and performances of display panels in display devices are getting higher.

In design of active-matrix organic light-emitting diode (AMOLED) display panels, how to achieve and ensure that AMOLEDs have a higher refresh rate has been a big problem. In current technology, a main problem about realizing a high refresh rate is how to improve a signal writing time. The signal writing time can be effectively improved by incorporating two signal lines in a sub-pixel design. However, when disposing the two signal lines, one of the signal lines is connected to a patterned semiconductor layer of display panels mainly by bridging, while this connection method easily causes a patterned pixel layer to have dense wirings and meanwhile results in small adjustment space for pixel design, and also increases influences of crosstalk between circuits in the display panels, thereby reducing stability of the display panels.

Therefore, it is necessary to provide a solution for the problems in current technology.

Technical problem: in summary, in current display panels, there are problems such as dense wirings in patterned pixel layers, small adjustment space for pixel design, greater crosstalk between circuits in the display panels, and poor stability of the display panels when disposing lines inside the display panels.

SUMMARY OF THE INVENTION

In order to solve the above problems, an embodiment of the present disclosure provides a display panel and a display device to solve problems of dense wirings in patterned pixel layers, small adjustment space for pixel design, greater crosstalk between circuits in display panels, and poor stability of the display panels in current display panels.

To solve the above technical problems, an embodiment of the present disclosure provides technical solutions as follows.

In a first aspect, an embodiment of the present disclosure provides a display panel. The display panel includes:
  a substrate;
  a plurality of data lines and scanning lines distributed in an array and disposed on the substrate;
  a semiconductor layer disposed on the substrate; and
  an insulating layer disposed on the substrate and covering the semiconductor layer;
  wherein the display panel further includes a first connecting hole and a second connecting hole respectively positioned on two adjacent data lines, the two adjacent data lines are respectively connected to the semiconductor layer corresponding to a pixel at an N-th row and the semiconductor layer corresponding to another pixel at an (N+1)-th row through the first connecting hole and the second connecting hole, and the first connecting hole is positioned on the semiconductor layer corresponding to the pixel at the N-th row.

According to an embodiment of the present disclosure, corresponding to the two adjacent data lines, the semiconductor layer corresponding to the pixel at the N-th row and the semiconductor layer corresponding to the pixel at the (N+1)-th row have a mirror image arrangement with respect to a first direction.

According to an embodiment of the present disclosure, the second connecting hole is positioned on the semiconductor layer corresponding to the pixel at the (N+1)-th row.

According to an embodiment of the present disclosure, the first direction is same as a length direction of the data lines.

According to an embodiment of the present disclosure, the semiconductor layer includes a first node, and the semiconductor layer corresponding to the pixel at the N-th row is electrically connected to the semiconductor layer corresponding to the pixel at the (N+1)-th row through the first node.

According to an embodiment of the present disclosure, in areas corresponding to the first connecting hole and the second connecting hole, the semiconductor layer overlaps the data lines, and a width of the semiconductor layer is greater than a width of the data lines.

According to an embodiment of the present disclosure, the data lines are disposed on the insulating layer, and the two adjacent data lines are disposed in a same layer.

According to an embodiment of the present disclosure, the insulating layer includes a plurality of hollowed-out areas exposing the first connecting hole and the second connecting hole.

In a second aspect, an embodiment of the present disclosure provides a display panel. The display panel includes:
  a substrate;
  a plurality of data lines and scanning lines distributed in an array and disposed on the substrate; and
  a semiconductor layer disposed on the substrate;
  wherein the display panel further includes a first connecting hole and a second connecting hole respectively positioned on two adjacent data lines, and the two adjacent data lines are respectively connected to the semiconductor layer corresponding to a pixel at an N-th row and the semiconductor layer corresponding to another pixel at an (N+1)-th row through the first connecting hole and the second connecting hole.

According to an embodiment of the present disclosure, corresponding to the two adjacent data lines, the semiconductor layer corresponding to the pixel at the N-th row and the semiconductor layer corresponding to the pixel at the (N+1)-th row have a mirror image arrangement with respect to a first direction.

According to an embodiment of the present disclosure, the first connecting hole is positioned on the semiconductor layer corresponding to the pixel at the N-th row, and the second connecting hole is positioned on the semiconductor layer corresponding to the pixel at the (N+1)-th row.

According to an embodiment of the present disclosure, the first direction is same as a length direction of the data lines.

According to an embodiment of the present disclosure, the semiconductor layer includes a first node, and the semiconductor layer corresponding to the pixel at the N-th row is electrically connected to the semiconductor layer corresponding to the pixel at the (N+1)-th row through the first node.

According to an embodiment of the present disclosure, in areas corresponding to the first connecting hole and the second connecting hole, the semiconductor layer overlaps the data lines, and a width of the semiconductor layer is greater than a width of the data lines.

According to an embodiment of the present disclosure, the display panel includes an insulating layer disposed on the substrate and covering the semiconductor layer.

According to an embodiment of the present disclosure, the data lines are disposed on the insulating layer, and the two adjacent data lines are disposed in a same layer.

According to an embodiment of the present disclosure, the insulating layer includes a plurality of hollowed-out areas exposing the first connecting hole and the second connecting hole.

In a third aspect, an embodiment of the present disclosure further provides a display device. The display device includes the display panel provided by the embodiments of the present disclosure.

Beneficial effect: in summary, the beneficial effect of the embodiments of the present disclosure is:

the embodiments of the present disclosure provide a display panel and a display device. Wherein, two adjacent data lines are respectively provided with a first connecting hole and a second connecting hole, the first connecting hole and the second connecting hole are respectively positioned in areas corresponding to a pixel at an N-th row and another pixel at an (N+1)-th row, and the two adjacent data lines are electrically connected to a corresponding semiconductor layer through the first connecting hole and the second connecting hole. A wiring structure of the present disclosure prevents data signal lines from being connected to the semiconductor layer by bridging, meanwhile effectively solves problems of dense wirings and small adjustment space for pixel design, and further improves greater crosstalk between circuits inside a panel.

DESCRIPTION OF SPECIFIC EMBODIMENTS OF THE INVENTION

The specific embodiments described with reference to the attached drawings are all exemplary and are intended to illustrate and interpret the present disclosure.

Figure 1:
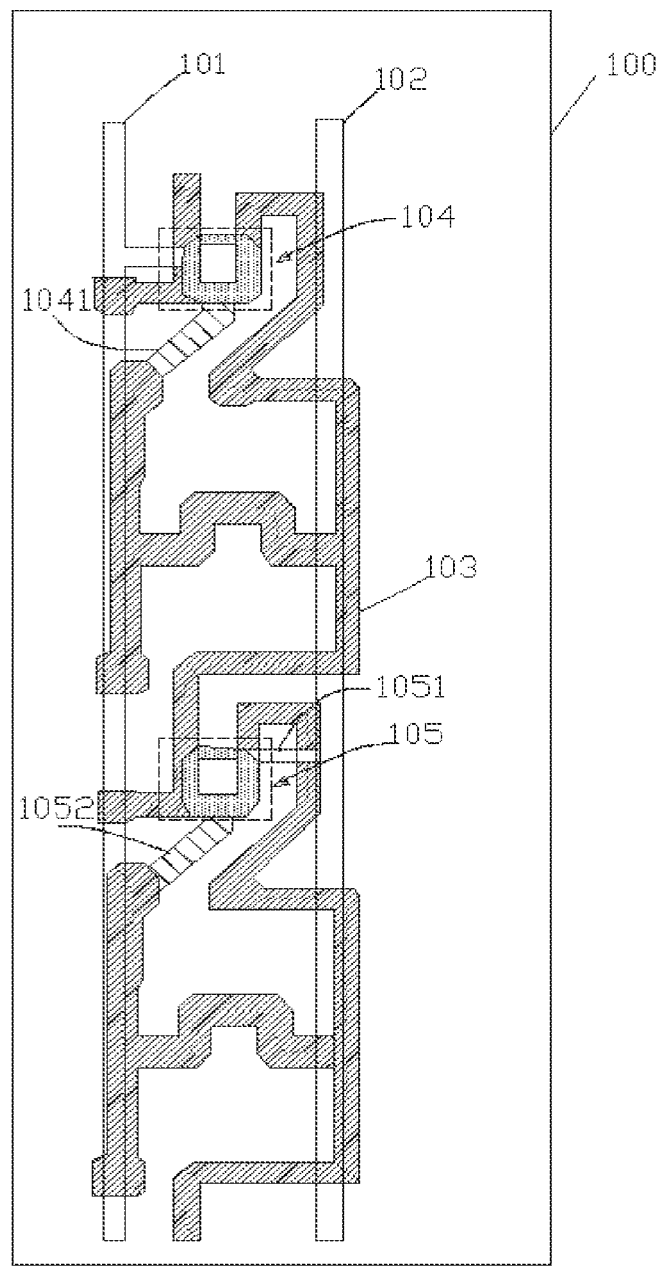
FIG. 1 is a schematic top view of a structure of a display panel in current technology.

As shown in FIG. 1, FIG. 1 is a schematic top view of a structure of a display panel in current technology. The display panel includes a base substrate 100 and a plurality of data lines and scanning lines disposed on the base substrate 100.

Specifically, the data lines and scanning lines are arranged in an array along row and column directions of the base substrate. The embodiment of FIG. 1 includes a first data line 101 and a second data line 102. The first data line 101 and the second data line 102 are disposed adjacent to each other. Meanwhile, the display panel further includes a semiconductor layer 103. The semiconductor layer 103 is disposed on the base substrate 100 and a display area corresponding to each pixel of the display panel.

The display panel further includes a first connecting hole 104 and a second connecting hole 105. Since the data lines and the semiconductor layer 103 are disposed on different film layers, usually, there are a plurality of connecting holes in current design. Two adjacent data lines are respectively electrically connected to the semiconductor layer 103 correspondingly through the first connecting hole 104 and the second connecting hole 105, thereby forming a complete structure of thin film transistors. Since the connecting holes are positioned in an area between the two adjacent data lines, both the first data line 101 and the second data line 102 need to be electrically connected to the semiconductor layer 103 through corresponding connecting holes by bridging, such as a first connecting bridge 1041, a second connecting bridge 1051, and a third connecting bridge 1052 shown in FIG. 1, thereby forming a complete circuit structure of the display panel.

However, the above bridging method for connections makes wirings inside the display panel more complex, causing each patterned pixel layer to have dense wirings, and increasing crosstalk problems between circuits inside the panel.

Figure 2:
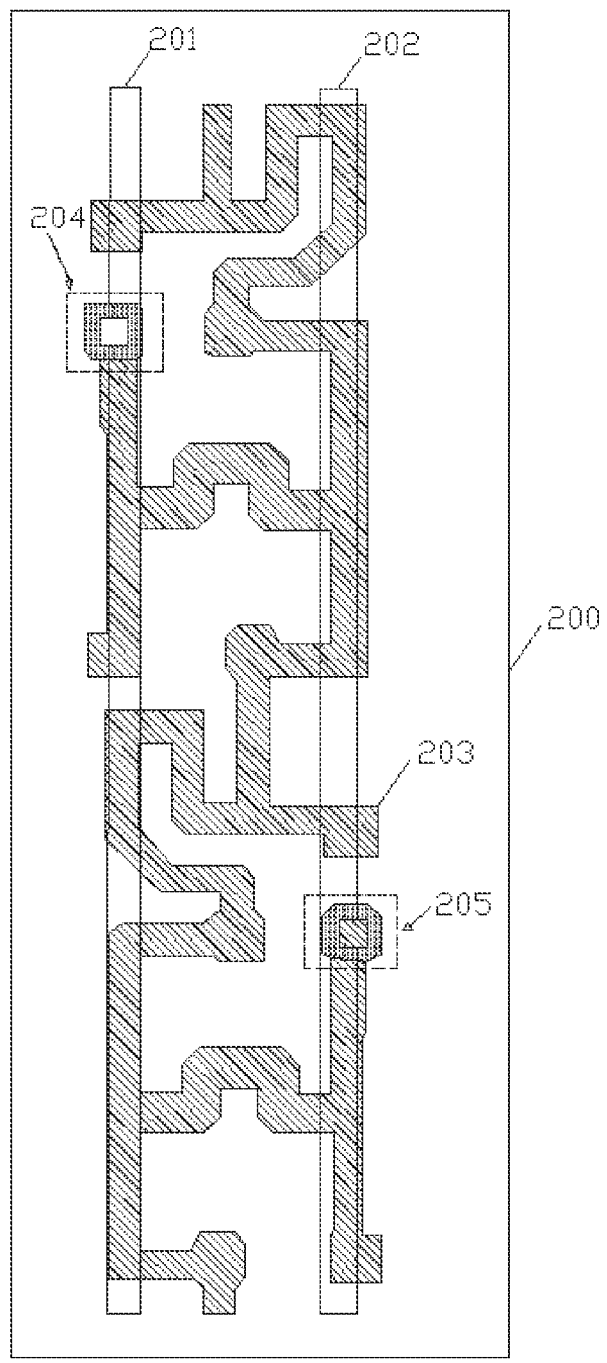
FIG. 2 is a schematic top view of a structure of a display panel according to an embodiment of the present disclosure.

As shown in FIG. 2, FIG. 2 is a schematic top view of a structure of a display panel according to an embodiment of the present disclosure. The display panel includes a substrate 200 and a plurality of data lines and scanning lines disposed on the substrate 200 and arranged in an array along row and column directions of the substrate 200.

Specifically, this embodiment of the present disclosure includes a first data line 201 and a second data line 202. Wherein, the first data line 201 and the second data line 202 are disposed adjacent to each other. This embodiment only takes the data lines as an example for description.

Specifically, the display panel further includes a semiconductor layer 203 disposed on the substrate 200. In each display area of the display panel corresponding to each pixel area, the semiconductor layer 203 is provided to obtain a complete structure of thin film transistors.

In this embodiment, a structure of the semiconductor layer 203 corresponding to a pixel area at an N-th row and a pixel area at an (N+1)-th row adjacent to each other is taken as an example for description.

Specifically, the display panel further includes a plurality of connecting holes, and this embodiment takes a first connecting hole 204 and a second connecting hole 205 as an example for description. Wherein, the first connecting hole 204 and the second connecting hole 205 are respectively positioned on two adjacent data lines, that is, the first connecting hole 204 is disposed in an area corresponding to the first data line 201, and the second connecting hole 205 is disposed in an area corresponding to the second data line 202.

Preferably, the first connecting hole 204 may be disposed on the semiconductor layer 203 corresponding to the pixel area at the N-th row, and the second connecting hole 205 may be disposed on the semiconductor layer 203 corresponding to the pixel area at the (N+1)-th row.

Since both the first data line 201 and the second data line 202 need to be electrically connected to the semiconductor layer 203, in this embodiment, the first data line 201 is electrically connected to the semiconductor layer 203 in a corresponding area through the first connecting hole 204, and the second data line 202 is electrically connected to the semiconductor layer 203 in another corresponding area through the second connecting hole 205, thereby realizing transmission of all data signals and control signals.

In this embodiment, in order to simplify a circuit layout structure of the semiconductor layer 203 between the two adjacent data lines, the connecting holes are directly positioned in the areas corresponding to the first data line 201 and the second data line 202. When electrical connections are formed through the connecting holes, the data lines can be directly connected to the semiconductor layer in corresponding areas without disposing connecting bridge structures, thereby effectively simplifying a circuit layout structure of the display panel and reducing crosstalk problems between circuits.

Further, when forming the first connecting hole 204 and the second connecting hole 205, in areas corresponding to the first connecting hole 204 and the second connecting hole 205, a width of the semiconductor layer 203 or an area of connected areas of the semiconductor layer 203 is greater than a width of the first data line 201 or the second data line 202. Therefore, when in connection, a small contact area can be prevented from affecting normal operation of the display panel, and connection reliability can be ensured.

Meanwhile, since the first data line 201 and the second data line 202 are disposed on different layers from the semiconductor layer 203, the display panel further includes an insulating layer disposed on the substrate 200 and completely covering the semiconductor layer 203, and the first data line 201 and the second data line 202 are disposed in corresponding areas above the insulating layer and are electrically connected to the semiconductor layer 203 through different connecting holes.

Therefore, when disposing the insulating layer, the insulating layer includes a plurality of hollowed-out areas in areas corresponding to the first connecting hole 204 and the second connecting hole 205, and the first connecting hole 204 and the second connecting hole 205 can be exposed by forming the hollowed-out areas, thereby realizing conduction.

Figure 3:
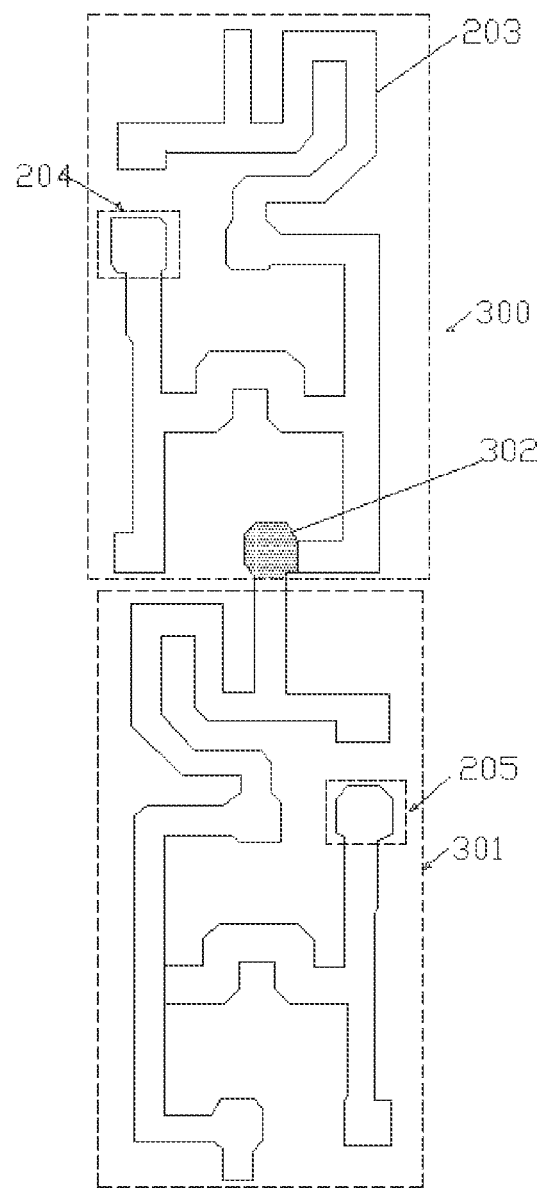
FIG. 3 is a schematic structural diagram of a semiconductor layer according to an embodiment of the present disclosure.

As shown in FIG. 3, FIG. 3 is a schematic structural diagram of a semiconductor layer according to an embodiment of the present disclosure. This embodiment takes the semiconductor layer 203 in an area corresponding to the pixel at the N-th row and the pixel at the (N+1)-th row as an example for description. The pixel at the N-th row corresponds to a first area 300, and the pixel at the (N+1)-th row corresponds to a second area 301. Wherein, the first area 300 and the second area 301 are arranged adjacent to each other.

Preferably, the semiconductor layer 203 also includes a first node 302. The first node 302 may be disposed between the first area 300 and the second area 301, and meanwhile, the semiconductor layer 203 corresponding to the first area 300 is electrically connected to the semiconductor layer 203 corresponding to the second area 301 by the first node 302. Semiconductors 203 corresponding to the first area 300 and the second area 301 are disposed on a same layer.

The display panel may also include a plurality of first nodes 302, and this embodiment only takes the first node 302 as an example for description.

Further, in order to simplify arrangement structures of other electrode lines such as each film layer inside the display panel and the semiconductor layer, in this embodiment, the semiconductor layer 203 in the first area 300 and the semiconductor layer 203 in the second area 301 have a mirror image arrangement with respect to a first direction.

Preferably, the first direction can be a direction of the first data line or the second data line, or can be same as a length disposition direction of the data lines. In this embodiment, the first direction is selected as a middle line of the first data line and the second data line as an example for description. The semiconductor layer 203 in the first area 300 is mirrored and symmetrical with respect to the middle line to obtain a structure of the semiconductor layer 203 in the second area 301.

The semiconductor layer 203 in the first area 300 and the second area 301 have the mirror image arrangement, thereby simplifying circuit layouts in each pixel area. Meanwhile, the first connecting hole 204 and the second connecting hole 205 are disposed in the areas corresponding to the data lines and the semiconductor layer 203. When in connection, the first data line can be directly electrically connected to the semiconductor layer 203 through the first connecting hole 204, and the second data line can also be directly electrically connected to the semiconductor layer 203 through the second connecting hole 205 without connecting bridge structures, and meanwhile, the connecting holes may not be positioned in the first area 300 or in the second area 301 to increase complexity of the circuit layouts. Therefore, the crosstalk problems among each film layer, lines on film layers, and electrode layers can be reduced.

Combining the schematic structural diagrams in FIGS. 2 and 3, in this embodiment, projections of the first data line 201 and the second data line 202 on the substrate 200 may partially overlap the semiconductor layer 203. Meanwhile, in order to ensure a connection effect of the connecting holes, in areas corresponding to the connecting holes, an area of the semiconductor layer 203 is greater than an area or a width of the data lines to allow the projections of the data lines on the substrate 200 to be within the semiconductor layer 203.

Further, an embodiment of the present disclosure also provides a display device including the display panel provided by the embodiments of the present disclosure. The data lines, the semiconductor layer, and the connecting holes inside the display panel are those structures described in the embodiments. A circuit structure inside the display device is simple, meanwhile, the crosstalk between device elements are reduced, and display quality and display effect are good.

The display panel and the display device provided by the present disclosure are described in detail above. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A display panel, comprising:
a substrate;
a plurality of data lines and scanning lines distributed in an array and disposed on the substrate;
a semiconductor layer disposed on the substrate; and
an insulating layer disposed on the substrate and covering the semiconductor layer;
wherein the display panel further comprises a first connecting hole and a second connecting hole respectively positioned on two adjacent data lines, the two adjacent data lines are respectively connected to the semiconductor layer corresponding to a pixel at an N-th row and the semiconductor layer corresponding to another pixel at an (N+1)-th row through the first connecting hole and the second connecting hole, and the first connecting hole is positioned on the semiconductor layer corresponding to the pixel at the N-th row; and wherein corresponding to the two adjacent data lines, the semiconductor layer corresponding to the pixel at the N-th row and the semiconductor layer corresponding to the pixel at the (N+1)-th row have a mirror image arrangement with respect to a first direction, and the first direction is same as a length direction of the data lines.

2. The display panel according to claim 1, wherein the second connecting hole is positioned on the semiconductor layer corresponding to the pixel at the (N+1)-th row.

3. The display panel according to claim 1, wherein the semiconductor layer comprises a first node, and the semiconductor layer corresponding to the pixel at the N-th row is electrically connected to the semiconductor layer corresponding to the pixel at the (N+1)-th row through the first node.

4. The display panel according to claim 1, wherein in areas corresponding to the first connecting hole and the second connecting hole, the semiconductor layer overlaps the data lines, and a width of the semiconductor layer is greater than a width of the data lines.

5. The display panel according to claim 1, wherein the data lines are disposed on the insulating layer, and the two adjacent data lines are disposed in a same layer.

6. The display panel according to claim 1, wherein the insulating layer comprises a plurality of hollowed-out areas exposing the first connecting hole and the second connecting hole.

7. A display panel, comprising:
a substrate;
a plurality of data lines and scanning lines distributed in an array and disposed on the substrate; and
a semiconductor layer disposed on the substrate;
wherein the display panel further comprises a first connecting hole and a second connecting hole respectively positioned on two adjacent data lines, and the two adjacent data lines are respectively connected to the semiconductor layer corresponding to a pixel at an N-th row and the semiconductor layer corresponding to another pixel at an (N+1)-th row through the first connecting hole and the second connecting hole; and
wherein the semiconductor layer comprises a first node, and the semiconductor layer corresponding to the pixel at the N-th row is electrically connected to the semiconductor layer corresponding to the pixel at the (N+1)-th row through the first node.

8. The display panel according to claim 7, wherein corresponding to the two adjacent data lines, the semiconductor layer corresponding to the pixel at the N-th row and the semiconductor layer corresponding to the pixel at the (N+1)-th row have a mirror image arrangement with respect to a first direction, and the first direction is same as a length direction of the data lines.

9. The display panel according to claim 7, wherein the first connecting hole is positioned on the semiconductor layer corresponding to the pixel at the N-th row, and the second connecting hole is positioned on the semiconductor layer corresponding to the pixel at the (N+1)-th row.

10. The display panel according to claim 7, wherein in areas corresponding to the first connecting hole and the second connecting hole, the semiconductor layer overlaps the data lines, and a width of the semiconductor layer is greater than a width of the data lines.

11. The display panel according to claim 7, wherein the data lines are disposed on the insulating layer, and the two adjacent data lines are disposed in a same layer.

12. The display panel according to claim 7, wherein the insulating layer comprises a plurality of hollowed-out areas exposing the first connecting hole and the second connecting hole.

13. A display device, comprising a display panel, wherein the display panel comprises:
a substrate;
a plurality of data lines and scanning lines distributed in an array and disposed on the substrate;
a semiconductor layer disposed on the substrate; and
an insulating layer disposed on the substrate and covering the semiconductor layer;
wherein the display panel further comprises a first connecting hole and a second connecting hole respectively positioned on two adjacent data lines, and the two adjacent data lines are respectively connected to the semiconductor layer corresponding to a pixel at an N-th row and the semiconductor layer corresponding to another pixel at an (N+1)-th row through the first connecting hole and the second connecting hole, and the first connecting hole is positioned on the semiconductor layer corresponding to the pixel at the N-th row; and
wherein corresponding to the two adjacent data lines, the semiconductor layer corresponding to the pixel at the N-th row and the semiconductor layer corresponding to the pixel at the (N+1)-th row have a mirror image arrangement with respect to a first direction, and the first direction is same as a length direction of the data lines.

14. The display device according to claim 13, wherein the semiconductor layer comprises a first node, and the semiconductor layer corresponding to the pixel at the N-th row is electrically connected to the semiconductor layer corresponding to the pixel at the (N+1)-th row through the first node.

15. The display panel according to claim 1, wherein the semiconductor layer corresponding to the pixel at the N-th row and the semiconductor layer corresponding to the pixel at the (N+1)-th row are adjacent to each other and in a same layer.

16. The display panel according to claim 7, wherein the semiconductor layer corresponding to the pixel at the N-th row and the semiconductor layer corresponding to the pixel at the (N+1)-th row are adjacent to each other and in a same layer.

* * * * *